(12) United States Patent
Wang et al.

(10) Patent No.: US 6,297,167 B1
(45) Date of Patent: Oct. 2, 2001

(54) IN-SITU ETCH OF MULTIPLE LAYERS DURING FORMATION OF LOCAL INTERCONNECTS

(75) Inventors: Fei Wang, San Jose; James K. Kai, San Francisco; William G. En, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/924,574

(22) Filed: Sep. 5, 1997

(51) Int. Cl.[7] .................................................. H01L 21/027
(52) U.S. Cl. ............................. 438/714; 216/49; 216/72; 438/725; 438/740
(58) Field of Search .................... 216/17, 18, 37, 216/39, 41, 54, 67, 72; 438/694, 700, 710, 714, 717, 725, 735, 736, 737, 738, 740; 118/721, 723 R, 723 E, 723 ER, 723 I, 723 IR; 427/534, 535, 569, 576, 585, 307; 252/79.1

(56) References Cited

U.S. PATENT DOCUMENTS

| | | | |
|---|---|---|---|
| 5,298,112 | * | 3/1994 | Hayasaka et al. .................... 156/643 |
| 5,378,311 | * | 1/1995 | Nagayama et al. ................... 156/643 |
| 5,399,237 | * | 3/1995 | Keswick et al. ...................... 156/643 |
| 5,849,639 | * | 12/1998 | Molloy et al. ........................ 438/713 |
| 5,869,404 | * | 2/1999 | Kim et al. ............................. 438/738 |
| 5,872,063 | * | 2/1999 | Chao et al. ........................... 438/762 |
| 5,888,897 | * | 3/1999 | Liang .................................... 438/622 |
| 5,893,734 | * | 4/1999 | Jeng et al. ............................. 438/239 |
| 5,906,948 | * | 5/1999 | Liu et al. .............................. 438/689 |
| 5,915,202 | * | 6/1999 | Lo et al. ................................ 438/666 |
| 5,920,796 | * | 7/1999 | Wang et al. .......................... 438/700 |

FOREIGN PATENT DOCUMENTS

02127648 A * 5/1990 (JP) ..................................... 430/129

* cited by examiner

Primary Examiner—Randy Gulakowski
Assistant Examiner—Allan Olsen

(57) ABSTRACT

An in-situ etching process for creating local interconnects in a semiconductor device includes using a single etching tool to: etch through a masked dielectric layer to a stop layer using a mixture of $C_4F_8/CH_3F/Ar$ gasses; etch away the mask layer using a mixture of $O_2/Ar$ gasses; and etch through the stop layer using a mixture of $CH_3F/O_2$ gasses. The semiconductor device is not removed from the etching tool between the different etchings. The method then includes depositing conductive material to form local interconnects within the openings that were etched.

21 Claims, 3 Drawing Sheets

IN-SITU ETCH OF MULTIPLE LAYERS DURING FORMATION OF LOCAL INTERCONNECTS

TECHNICAL FIELD

The present invention relates to semiconductor devices and manufacturing processes, and more particularly to methods for providing local interconnections between two or more regions within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as via or trench that connects the selected regions together. The use of lower-level local interconnects reduces the coupling burden on the subsequently formed higher layers to provide such connectivity, which reduces the overall circuit size and as such tends to increase the circuit's performance. Accordingly, there is a continuing need for more efficient and effective processes for forming local interconnects.

SUMMARY OF THE INVENTION

The present invention provides an in-situ etching process for creating local interconnects using damascene techniques that provides better process control, reduces processing failures, speeds production, and reduces manufacturing costs. The in-situ etching process includes forming openings in a semiconductor wafer having a plurality of layers by using an etching tool to first etch through selected portions of a first underlying layer of the semiconductor wafer using a mixture of $C_4F_8/CH_3F$ gasses. The selected portions of the first underlying layer are defined by etch windows formed by a mask layer formed on the first underlying layer.

The method further includes using the same etching tool to etch away the mask layer using $O_2$ gas. In certain embodiments, the first underlying layer is a dielectric layer, such as, for example, an oxide layer. The method in other embodiments also includes supplying Argon (Ar) gas to the etching tool when etching either of the first underlying and mask layers.

In yet other embodiments, the method includes using the same etching tool to further etch through selected portions of a second underlying layer, that is below the first underlying layer, using a mixture of $CH_3F/O_2$ gasses. In these embodiments, the selected portions of the second underlying layer are defined by etched openings in the first underlying layer that correspond to the etch windows in the mask layer. In certain embodiments of the present invention, the second underlying layer is a stop layer, such as, for example, a silicon nitride (e.g., $Si_3N_4$), or silicone oxynitride (e.g., $SiO_xN_y$, referred to hereinafter simply as SiON) layer.

In still other embodiments, the method also includes depositing a conductive material within a local interconnect opening that was etched in-situ and extends through the first and second underlying layers. In certain embodiments, the conductive layer includes tungsten (W).

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process low for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the important features of the present invention.

In accordance with an embodiment of the present invention, there is provided an in-situ etching process for use in fabricating local interconnects within an integrated circuit manufacturing process. The in-situ etching process eliminates the need to relocate or otherwise move a semiconductor wafer between different process tools. Consequently, the in-situ etching process of the present invention advantageously provides a simpler process that is repeatable, and further provides for the cleaning of polymer deposits from within the etching tool during the in-situ etching process. As such, the present invention tends to provide better process control over the local interconnect damascene etching and fabrication processes, reduce the likelihood of damaging the semiconductor wafer/devices, speed production, and reduce manufacturing costs.

Figure 1:
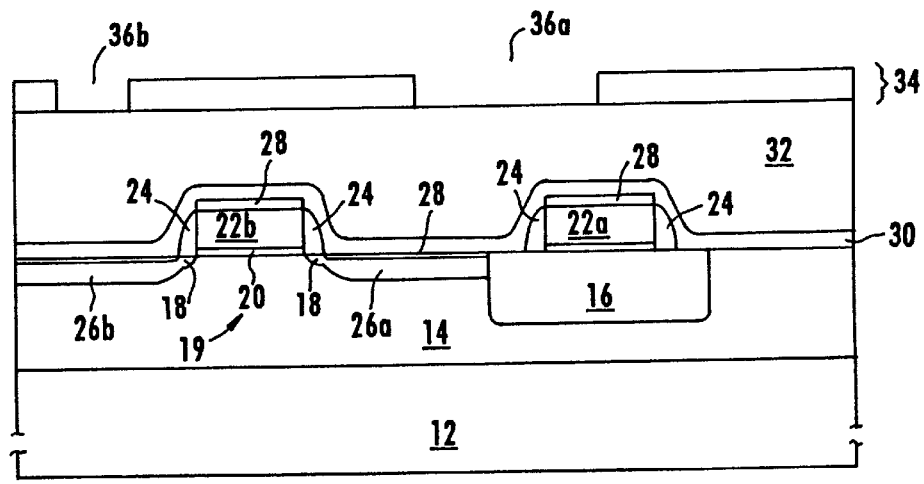
FIG. 1 depicts a cross-section of a semiconductor wafer which has been prepared for local interconnect etching, in accordance with an embodiment of the present invention.

FIG. 1 depicts a cross-section of a portion 10 of a semiconductor device being fabricated on a semiconductor wafer, in accordance with the present invention. Portion 10 includes a substrate 12 and a device region 14. For example, in certain embodiments of the present invention substrate 12 is a heavily-doped silicon substrate approximately 2 mm thick and device region 12 is a lightly-doped epitaxial (epi) layer, approximately 4 $\mu$m thick, which is grown on the heavily-doped silicon substrate. An isolation region 16 is formed within device region 14 to separate active regions that will be used to fabricate the semiconductor devices. In certain embodiments of the present invention, each isolation region 16 is a shallow trench region that is lined with a thin oxide liner and subsequently filled with a thicker field oxide that is approximately 2,500 to 3,500 Å thick. One or more conductors, such as, for example, gate conductor 22a, can be formed above isolation region 16.

Within an active region there is provided space to form an active device, such as a field effect transistor, or other component. As depicted in FIG. 1, an exemplary field effect transistor 19 is created by forming a gate conductor 22b above the active region that includes a drain region 26a and a source region 26b. The formation of drain and source regions 26a and 26b is well known to those skilled in the art.

As depicted, gate conductors 22a and 22b were formed using the same or similar processes and as such share a common design. Thus, for example, in one embodiment of the present invention, a thin barrier oxide layer 20, approximately 55 Å thick, is formed on top of isolation region 16 and device region 14. Next, gate conductors 22a and 22b are formed on top of thin barrier oxide layer 20 using polycrystalline silicon that is approximately 1,700 Å thick. Also within the active region, lightly doped regions 18, drain region 26a and source region 26b are formed through conventional ion-implantation processes, for example by using lithography masking techniques. Additionally, as is known in the art, spacers 24, such as oxide spacers, are provided along the sidewalls of gate conductor 22b to further control the doping of lightly doped regions 18. In certain embodiments, as is known in the art, a titanium-silicide layer 28, or other like layer, is formed on the exposed surfaces of gate conductors 22a and 22b, and region 26a and 26b.

Portion 10 further includes a conformal stop layer 30, such as, for example, a thin nitride layer approximately 800 Å thick, formed on top of the wafer stack, including gate conductors 22a and 22b and other exposed regions. A dielectric layer 32, for example, a tetraethylorthosilicate (TEOS) oxide layer approximately 12000 Å thick, is then applied over stop layer 30 using conventional processes, such as a plasma-enhanced chemical vapor deposition (PECVD) process. The exposed top surface of dielectric layer 32 is then planarized, for example, using an oxide chemical-mechanical polish (CMP), leaving dielectric layer 32 approximately 6500 to 9500 Å thick and substantially planar on top (e.g., as depicted in FIG. 1). Next, a resist mask 34, such as, for example, a deep-UV resist mask, is applied to dielectric layer 32 to define one or more etch windows, such as etch windows 36a and 36b, for use in forming one or more local interconnects.

Figure 2:
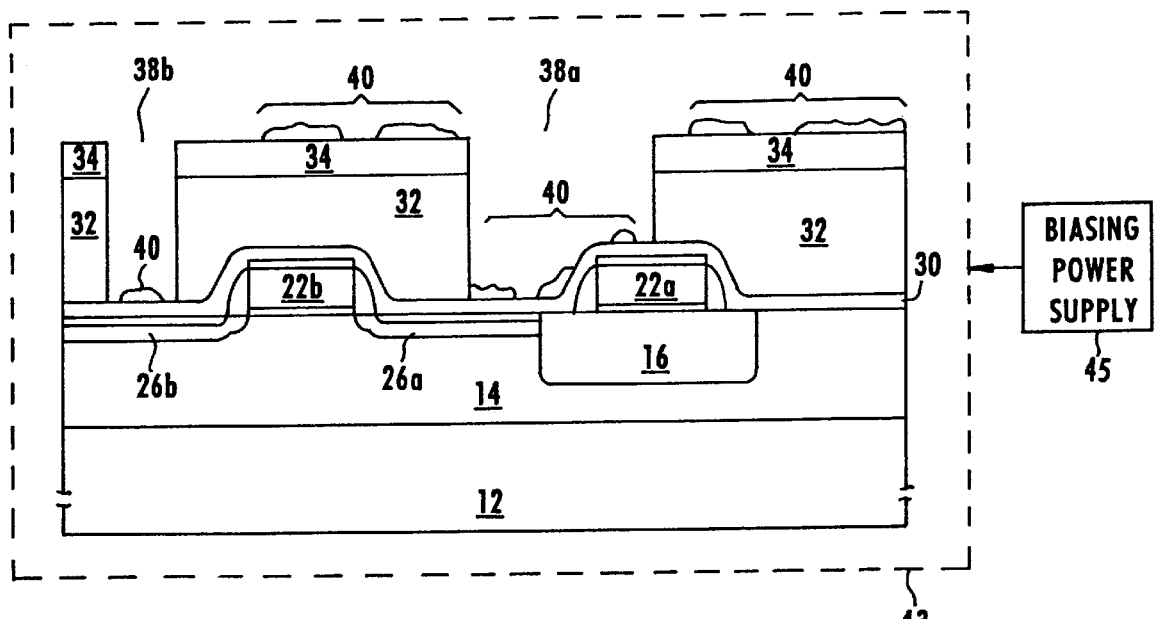
FIG. 2 depicts a cross-section of the portion of FIG. 1 following a first local interconnect etching process, in accordance with an embodiment of the present invention.

FIG. 2 depicts portion 10 of FIG. 1 following a dielectric etching process in an etching tool 43 in which etched openings 38a and 38b are created through etch windows 36a and 36b, respectively, and extend through dielectric layer 32 to stop layer 30. As depicted, the dielectric etching process, which is preferably an anisotropic etching process, removed the dielectric layer 32 material located substantially below etch windows 36a and 36b. By way of example, if dielectric layer 32 is an oxide layer and stop layer 30 is a nitride layer then an oxide etching process having a high-selectivity to nitride can be used to etch through oxide layer 32 and stop on the nitride layer 30.

As further illustrated in FIG. 2, the dielectric etching process described above tends to produce polymer deposits 40 that can form on various surfaces of portion 10, including, for example, resist mask 34, stop layer 30 and dielectric layer 32. For example, an oxide etching process tends to produce silicon-rich polymer deposits within and without etched openings 38a and 38b. Regardless of their location, size, and/or shape, polymer deposits 40 typically need to be removed to allow for the proper formation of the local interconnects or future layers in subsequent process steps.

In previous semiconductor processes, polymer deposits 40 are removed during one or more subsequent resist stripping processes. Thus, for example, following the dielectric etching process the semiconductor wafer is removed from etching tool 43 to a stripping tool (not shown) where resist mask 34 and polymer deposits 40 are then removed. The resulting portion 10 is depicted in FIG. 3.

Figure 3:
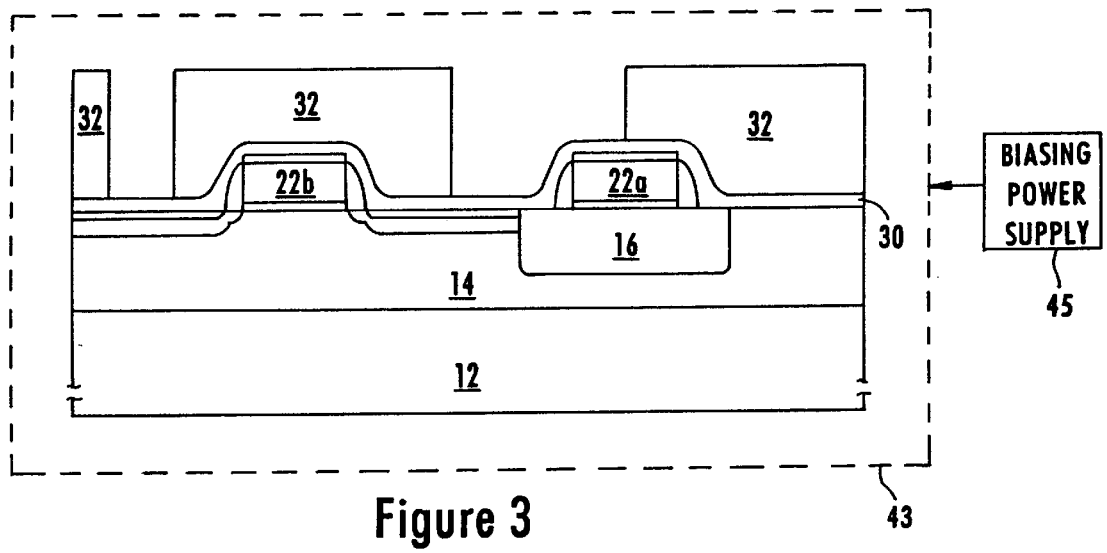
FIG. 3 depicts a cross-section of the portion of FIG. 2 following a second local interconnect etching process, in accordance with an embodiment of the present invention.

In accordance with the present invention, portion 10 in FIG. 3 is achieved without removing the semiconductor wafer from etching tool 43 by including an in-situ removal process that etches away resist mask 34 and polymer deposits 40 in the same etching tool as used in the previous dielectric etching process. This in-situ removal of the resist mask 34 and polymer deposits 40 eliminates the need to further handle the semiconductor wafer when moving it between two or more tools. As a result, the potential for contamination and/or other damage to the devices formed on the semiconductor wafer are reduced, the throughput of the fabrication process tends to increase and related manufacturing costs tend to be reduced.

The in-situ removal process will be described in greater detail below, following an overview of the remaining damascene process steps in forming local interconnects within etched openings 38a and 38b.

Figure 4:
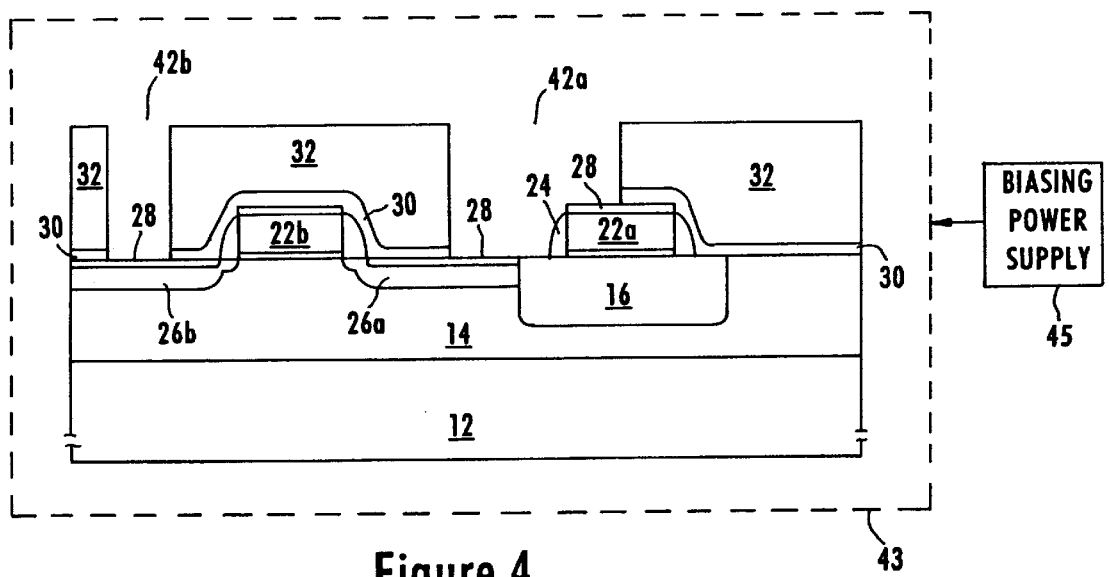
FIG. 4 depicts a cross-section of the portion of FIG. 3 following a third local interconnect etching process, in accordance with an embodiment of the present invention.

The next process step includes etching away exposed portions of stop layer 30 to reveal portions of silicide layer 28 over gate conductors 22a and 22b, and regions 26a and 26b. The resulting portion 10 is depicted in FIG. 4. As shown, once the exposed portions of stop layer 30 have been etched away, a local interconnect opening remains, such as local interconnect openings 42a and 42b, that provide access to selected active regions, and/or gate conductors, or other areas within portion 10.

In previous semiconductor processes, in order to etch stop layer 30, the semiconductor wafer would be moved from the stripping tool that previously removed resist mask 34 and polymer deposits 40 to an etching tool configured to selectively etch the stop layer 30 by providing a high-selectivity to the materials in dielectric layer 32, spacers 24, titanium-silicide layer 28, and/or other exposed non-stop layer components.

In accordance with the present invention, portion 10 in FIG. 4 is achieved without having to move the semiconductor wafer back to an etching tool to remove the stop layer 30. Instead, with the in-situ etching process described above, the semiconductor wafer was not removed from etching tool 43 in the first place, and therefore the in-situ etching process can continue in order to etch away the exposed portions of stop layer 30 by changing the etching recipe to remove the material in stop layer 30.

Thus, in certain embodiments of the present invention, the in-situ etching process is essentially a three-step process that in the first step etches through dielectric layer 32, in the second step etches away resist mask 34 and polymer deposits 40, and in the third step etches away exposed portions of stop layer 30. All of these steps are performed without removal of the semiconductor wafer from the etching tool 43.

The etching recipes, in accordance with the present invention, are preferably used to etch a semiconductor wafer as described above within a plasma etching tool, such as, for example a Centura System available from Applied Material of Santa Clara, Calif. However, those skilled in the art will recognize that the various parameters associated with the etching process and recipes are adjustable for differing arrangements, semiconductor wafers, layer stacks, layer materials, etching tools, and other common semiconductor manufacturing apparatus. As such, it is recognized that the present invention can be practiced with or without all of the parameters being adjusted or provided as described herein.

The first etching process, or the first of a two or three step in-situ etching process, preferably includes anisotropically etching away dielectric layer 32, which includes TEOS oxide, using a mixture of a high polymer gas, such as, for example, $C_4F_8/CH_3F/Ar$ gasses. The $C_4F_8$ gas is preferably supplied at a rate between approximately 5 and 20 sccm, more preferably at a rate between approximately 10 and 15 sccm, and most preferably at a rate of approximately 12 sccm. The $CH_3F$ gas is preferably supplied at a rate approximately 20 sccm or less, more preferably at a rate approximately 10 sccm or less, and most preferably at a rate of approximately 6 sccm. The Ar gas is preferably supplied at a rate between approximately 200 sccm or less, more preferably at a rate between approximately 50 and 150 sccm, and most preferably at a rate of approximately 100 sccm. This first etching process provides a high selectivity to nitride, which is the preferred material for stop layer 30, and as such the etching process is timed or otherwise controlled to end when stop layer 30 is reached.

The second etching process, or the second step, preferably includes isotropically etching away resist mask 34 and polymer deposits 40 using a mixture of $O_2$ gas, and Ar gas. The $O_2$ gas is preferably supplied at a rate between approximately 50 and 300 sccm, more preferably at a rate between approximately 150 and 250 sccm, and most preferably at a rate of approximately 200 sccm. The Ar gas, which is used to stabilize the plasma if required, is preferably supplied at a rate approximately 100 sccm or less, more preferably at a rate approximately 50 sccm or less, and most preferably not at all (i.e., 0 sccm).

Additionally, a biasing power from a biasing power supply 45 is provided to a reactor chamber, such as, for example a plasma etching chamber, within etching tool 43 during an initial portion of the second etching process to further the etching of polymer deposits 40. The biasing power is preferably supplied at between approximately 100 Watts (W) and 400 W, more preferably between approximately 150 W and 300 W, and most preferably at approximately 200 W. It has been found that when the biasing power is too high damage can occur to the exposed portions of titanium-silicide layer 28. Also, in one embodiment, this second etching process includes applying the biasing power for approximately the first 10–20 seconds of a 60–70 second timed process. This second etching process provides a high-selectivity to the nitride in stop layer 30, and is timed or otherwise controlled to end when resist mask 34 and polymer deposits 40 have been substantially removed.

The third etching process, or the third step, preferably includes anisotropically etching away stop layer 30, which is in certain embodiments is a layer of nitride, using a mixture of $CH_3F$ gas and $O_2$ gas. The $CH_3F$ gas is preferably supplied at a rate between approximately 20 and 60 sccm, more preferably at a rate between approximately 30 and 50 sccm, and most preferably at a rate of approximately 40 sccm. The $O_2$ gas is preferably supplied at a rate between approximately 5 and 30 sccm, more preferably at a rate between approximately 5 and 15 sccm, and most preferably at a rate of approximately 10 sccm. This third etching process provides a high-selectivity to the oxide of dielectric layer 32 and spacers 24, and/or the silicide formed on gate conductors 22a and 22b and region 26a and 26b, for example. This third etching process is preferably timed or otherwise controlled to end when titanium-silicide layer 28 is reached.

Those skilled in the art will recognize that the etching processes described above are representative of a preferred mixture having associated ratios of gasses that are fully adaptable to other systems/arrangements based on the recipes of the present invention.

Figure 5:
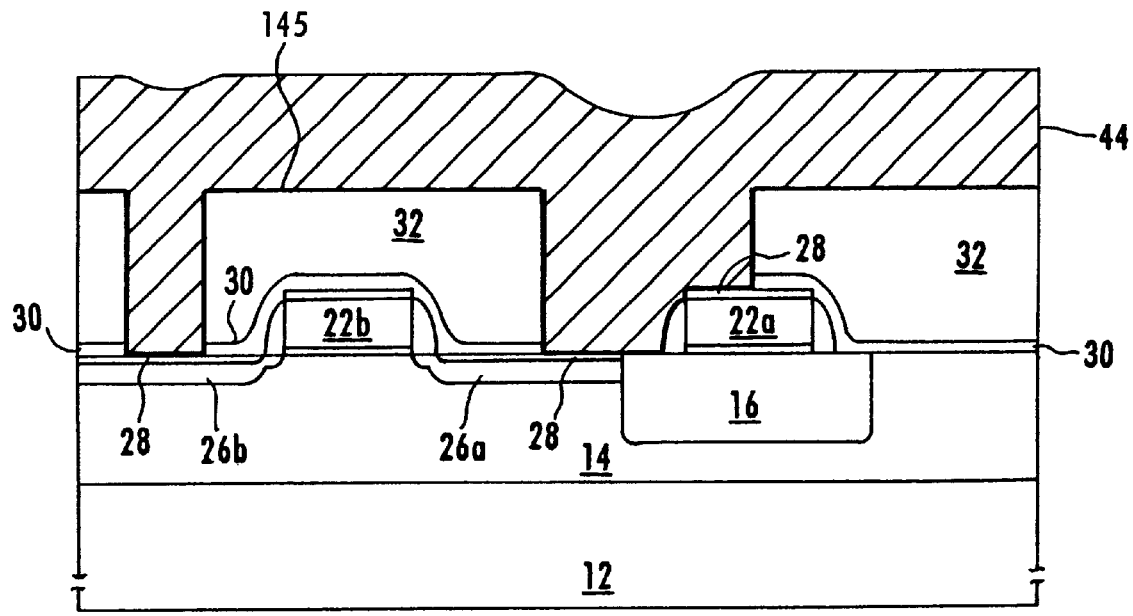
FIG. 5 depicts a cross-section of the portion of FIG. 4 following deposition of a conductive layer in the local interconnect openings of FIG. 4, in accordance with an embodiment of the present invention.
Figure 6:
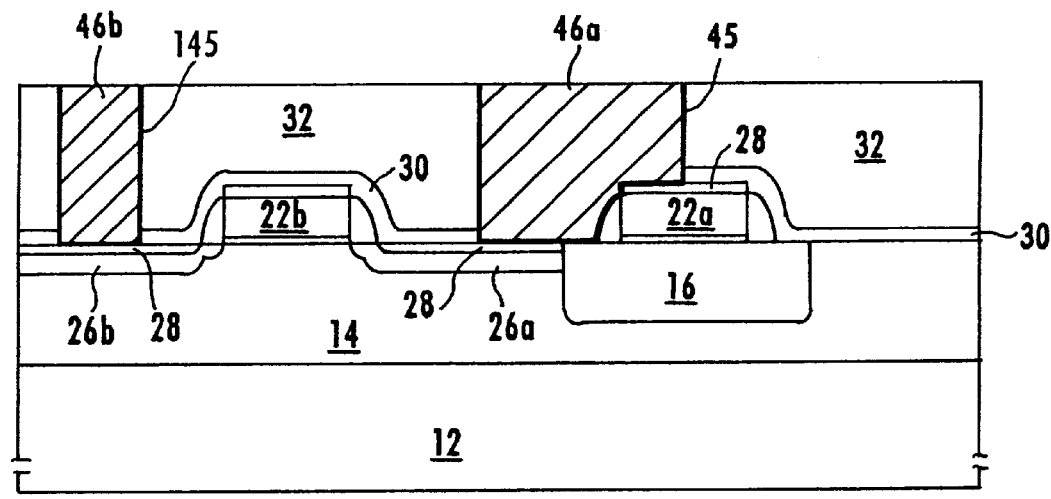
FIG. 6 depicts a cross-section of the portion of FIG. 5 following polishing of the conductive layer of FIG. 5, in accordance with an embodiment of the present invention.

Having formed local interconnect openings 42a and 42b, in accordance with the present invention, subsequent process steps include filling openings 42a and 42b with a conductive layer 44 as depicted in FIG. 5, and planarizing the semiconductor wafer to leave local interconnects 46a and 46b as depicted in FIG. 6, for example. Conductive layer 44 serves to complete the local interconnects by providing a conductive medium between two or more active regions/contacts. For example, gate conductor 22a and silicide 28 thereon, are electrically coupled to the silicide formed on drain region 26a by local interconnect 46a. Conductive layer 44 is deposited in certain embodiments using conventional deposition techniques, such as, for example, a plasma-enhanced chemical vapor deposition (PECVD) process.

In certain preferred embodiments of the present invention, conductive layer 44 includes a thin film 145 of titanium and titanium nitride (Ti/TiN) which is sputtered over, or otherwise deposited over, the semiconductor wafer and into local interconnect openings 42a and 42b, followed by a thick layer of tungsten. The thin film 145 of Ti/TiN provides for increased adhesion of the tungsten and lower contact resistance for the resulting local interconnects 46a and 46b. Following the deposition of conductive layer 44, the semiconductor wafer is planarized, such as, for example, using a chemical-mechanical polish (CMP) process, which removes all of conductive layer 44, expect those portions which have been deposited within local interconnect openings 42a and 42b, thereby forming local interconnects 46a and 46b, respectively.

Thus, in accordance with the present invention, the in-situ removal process which etches away both the resist mask 34 and polymer deposits 40 in the same etching tool 43 eliminates the need to further handle the semiconductor wafer when moving it between two or more tools. As a result, the fabrication of local interconnects 46a and 46b, for example, is enhanced by reducing the potential for contamination due to excessive handling of the wafer, or incomplete/inadequate removal process steps, during the formation of the etched openings.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An in-situ method for forming openings in a semiconductor wafer having a plurality of layers, the method comprising:

using a single etching tool to etch through selected portions of a first underlying layer of a semiconductor wafer, wherein the selected portions of the first underlying layer are defined by etch windows formed by a mask resist layer on the first underlying layer;

using the etching tool to substantially etch away polymer deposits produced during the etch of the selected portions of the first underlying layer and the mask resist layer of the semiconductor wafer, wherein biasing power is applied during the etching away of the mask layer and the biasing power is turned off before the etching away of the mask layer has been completed; and, using the etching tool to etch through selected portions of a second underlying stop layer that is below the first underlying layer, wherein the selected portions of the second underlying stop layer are defined by etched openings in the first underlying layer corresponding to the etch windows.

2. The method as recited in claim 1, wherein the first underlying layer is a dielectric layer.

3. The method as recited in claim 2, wherein the first underlying layer is an oxide layer.

4. The method as recited in claim 1, wherein the mask layer is a resist layer.

5. The method as recited in claim 4, wherein the mask layer is etched using $O_2$ gas.

6. The method as recited in claim 1, wherein the selected portions of a first underlying layer of a semiconductor wafer are etched using a mixture of $C_4F_8/CH_3F$ gasses.

7. The method as recited in claim 1, further comprising supplying Argon (Ar) gas to the etching tool when etching at least one of the first underlying and mask layers.

8. The method as recited in claim 7, wherein the etching through of the first underlying layer includes using approximately 200 sccm or less of Argon (Ar) gas.

9. The method as recited in claim 7, wherein the etching away the mask layer includes using approximately 100 sccm or less of Argon (Ar) gas.

10. The method as recited in claim 1, wherein the second underlying layer is etched using a mixture of $CH_3F/O_2$ gasses.

11. The method as recited in claim 1, wherein the etching tool is a plasma etching tool configured to anisotropically etch one or more semiconductor wafers.

12. The method as recited in claim 11, wherein the etching tool includes a biasing power supply configured to supply a biasing power to a plasma chamber.

13. The method as recited in claim 12, wherein when etching away the mask layer further includes selectively supplying approximately 100 to 400 Watts of the biasing power to the plasma chamber.

14. The method as recited in claim 1, wherein the etching through of the first underlying layer includes using approximately 5 to 20 sccm of $C_4F_8$ gas.

15. The method as recited in claim 1, wherein the etching away the mask layer includes using approximately 5 to 300 sccm of $O_2$ gas.

16. The method as recited in claim 1, wherein the etching through of the second underlying layer includes using approximately 20 to 60 sccm of $CH_3F$ gas.

17. The method as recited in claim 1, wherein the etching through of the second underlying layer includes using approximately 20 sccm or less of $O_2$ gas.

18. The method as recited in claim 1, wherein the second underlying layer is a nitride layer.

19. The method as recited in claim 1, further comprising depositing a conductive material within a local interconnect opening that extends through the first and second underlying layers.

20. The method as recited in claim 19, wherein the conductive material includes at least one material selected from the set of tungsten (W), and titanium (Ti)/titanium-nitride (TiN).

21. The method as recited in claim 20, wherein the conductive material is applied using a plasma-enhanced chemical vapor deposition process.

* * * * *